Figure 1:
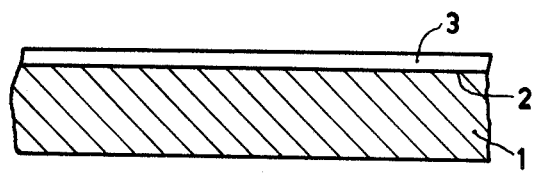
Figure 2:
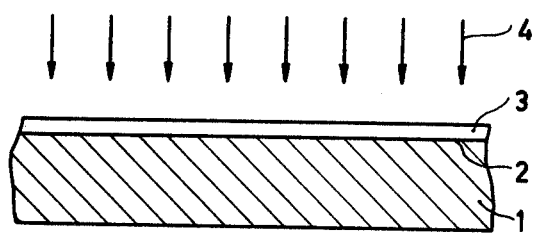

United States Patent [19]

Zandveld

[11] 4,104,085
[45] Aug. 1, 1978

[54] METHOD OF MANUFACTURING A SEMICONDUCTOR DEVICE BY IMPLANTING IONS THROUGH BEVELLED OXIDE LAYER IN SINGLE MASKING STEP

[75] Inventor: Paul Zandveld, Amsterdam, Netherlands

[73] Assignee: U.S. Philips Corporation, New York, N.Y.

[21] Appl. No.: 738,530

[22] Filed: Nov. 3, 1976

[30] Foreign Application Priority Data

Nov. 11, 1975 [NL] Netherlands .................. 7513161

[51] Int. Cl.² .......................................... H01L 21/265
[52] U.S. Cl. ...................................... 148/1.5; 148/187; 357/91; 357/13; 357/20
[58] Field of Search ................... 357/91, 20; 148/1.5, 148/187; 156/667, 652, 653, 657

[56] References Cited

U.S. PATENT DOCUMENTS

| | | | |
|---|---|---|---|
| 3,617,391 | 11/1973 | Lepselter | 148/1.5 |
| 3,666,548 | 5/1972 | Brack et al. | 117/212 |
| 3,697,829 | 10/1972 | Huth et al. | 317/235 R |
| 3,769,109 | 10/1973 | MacRae et al. | 156/3 |

OTHER PUBLICATIONS

M. Bakowski et al., "—Bevel Angle—on Breakdown Voltage of—Diffused PN Junctions" Sol. St. Electr. 18 (1975) 651.
P. Zandveld, "—Propert's of Ion–Implanted PN–Junctions in Si", Sol. St. Elec. 19 (1976) 659.
J.M. Fairfield et al., "Contacting Buried Ion Implanted Layers", IBM Tech. Discl. Bull. 13, 10/1970; 1052.

Primary Examiner—R Dean
Assistant Examiner—Upendra Roy
Attorney, Agent, or Firm—Frank R. Trifari

[57] ABSTRACT

Method of manufacturing a semiconductor device, in particular a capacitance diode, a zener diode or an avalanche diode, by using only one masking step. According to the invention, a first masking layer, for example a silicon oxide layer, is provided on a substrate of one conductivity type the etching rate of which at the surface is increased, for example, by an argon bombardment. A second masking layer is provided on the first masking layer and a window is etched therein. Via said window a first zone preferably of the same conductivity type as the substrate is implanted while using the second masking layer as a mask. The first masking layer is etched via the same window so that a bevelled edge is formed. By ion implantation via the window and a part of the bevelled edge, a second zone is formed which forms a p-n junction preferably with the first zone and the substrate.

15 Claims, 10 Drawing Figures

METHOD OF MANUFACTURING A SEMICONDUCTOR DEVICE BY IMPLANTING IONS THROUGH BEVELLED OXIDE LAYER IN SINGLE MASKING STEP

The invention relates to a method of manufacturing a semiconductor device, in which a first dopant is introduced selectively into a first surface part of a semiconductor region so as to form a first doped semiconductor zone, after which a second dopant is introduced selectively into a second surface part which comprises the first surface part and surrounds same entirely so as to form a second doped semiconductor zone.

The invention furthermore relates to a semiconductor device manufactured by using the method.

A method of the kind described in the preamble is disclosed in U.S. Pat. No. 3,345,221 and is used for the manufacture of, for example, capacitance diodes, zener diodes and avalanche (photo) diodes.

In the known method of manufacturing such diodes, a window is etched in an insulating layer provided on the semiconductor surface, usually a silicon oxide layer, after which a first zone of the same conductivity type as the substrate is provided, for example, by diffusion, while using the oxide layer as a mask. During a second etching step the window is then enlarged, after which, again while using the oxide layer as a mask, a second zone of a conductivity type opposite to that of the substrate is formed, which second zone has a sufficiently high doping to reverse the conductivity type of the first zone locally and in addition has a smaller thickness than the first zone.

In this manner, for example, a capacitance diode, an avalanche (photo) diode, or a zener diode is obtained, in which the part of the p-n junction which forms the boundary between the first and the second zone does not reach the surface and in addition is substantially flat. When, by the choice of the doping profiles, it is ensured that when increasing the reverse voltage across the p-n junction the break-down voltage is reached first at the said flat part of the p-n junction, the breakdown does not occur at the surface nor at edge portions of the p-n junction which have a very small radius of curvature, so that a reproducible and stable break down voltage is obtained.

However, for the described known method, at least two masking steps are necessary, which maskings should in addition be aligned rather accurately relative to each other. This makes the method rather complicated.

Moreover, in certain cases a comparatively high breakdown voltage is desired in which also a hyperabrupt doping profile is necessary across at least a part of the p-n junction. A hyperabrupt p-n junction is to be understood to mean a p-n junction or a part thereof between a first highly doped region of a first conductivity type and a second lower doped region of the second conductivity type, in which the doping concentration of said second region decreases in the direction away from the p-n junctinn, continuously or otherwise. Such conditions will be imposed in particular upon capacitance diodes and avalanche (photo) diodes. This can be achieved by choosing in the described known method the doping profiles to be so that prior to reaching the break-down voltage the boundary of the depletion region extends from a given value of the reverse voltage entirely into the original substrate region of the first conductivity type in which thus the first zone of the first conductivity type is surrounded entirely by the depletion region. In that case, however, the break-down will occur generally between the second zone of the second conductivity type and the substrate region, so that the curvature of the pn-junction in this case again plays a part and adversely influences the break down voltage either by reducing same, or in addition by the occurrence of instabilities as a result of local breakdown. In the determination of said breakdown voltage the surface also plays a part again.

One of the objects of the invention is to provide a method in which the said problems do not occur or occur at least to a considerably smaller extent. Another object of the invention is to provide a simple method in which, with the use of only one masking step, a diode can be obtained having a p-n junction comprising a so-called hyperabrupt portion which does not terminate at the surface. Still another object of the invention is to provide a very simple method of manufacturing a semiconductor device having a diode the p-n junction of which is partly of the hyperabrupt type but the breakdown voltage of which is not determined by said hyperabrupt portion.

The invention is inter alia based on the recognition that this can be achieved by a suitably chosen combination of ion implantations through one mask having a bevelled and through another mask having a non-bevelled edge.

Therefore, a method of the kind described in the preamble is characterized according to the invention in that a first masking layer is provided on the surface of the semiconductor region, that a second masking layer is provided on the first masking layer, that a window is provided in the second masking layer, that ions of the first dopant having such an Therefore, a method of the kind described in the preamble is characterized according to the invention in that a first masking layer is provided on the surface of the semiconductor region, that a second masking layer is provided on the first masking layer, that a window is provided in the second masking layer, that ions of the first dopant having such an energy that, outside the window, they are retained entirely and, inside the window, they are retained at most only partly, are implanted in the region so as to form the first doped zone, that the first masking layer is subjected to an etching treatment while using the second masking layer as a mask so that the layer at the edge of the etched-away part shows a transition region having a thickness increasing towards the exterior, after which, in order to form the second doped zone, ions of the second dopant are implanted into the surface with such an energy that, outside the transition region, the ions are retained entirely and are retained only partly by at least a part of the transition region.

As compared with the known method, the method according to the invention inter alia has the important advantage that only one masking step need be used so that the manufacture is considerably simplified and aligning steps are avoided. In addition, a p-n junction between the second zone and the substrate region may obtain a comparatively large radius of curvature at the edge in that the doping of the second zone gradually varies at the edge as a result of the gradually varying masking by the transition region.

An important preferred embodiment is characterized in that ions of a first dopant determining the first conductivity type are implanted to form the first doped semiconductor zone of the first conductivity type of higher doping than the semiconductor region, and that a second dopant determining the second conductivity type is implanted to form the second doped semiconductor zone of the second conductivity type and of a smaller thickness than the first doped zone, which second doped zone adjoins the whole second surface part, and forms with the first doped zone a p-n junction extending parallel to the surface.

According to a further important preferred embodiment, after providing the first masking layer and prior to providing the second masking layer, the first masking layer is subjected to a particle bombardment as a result of which the etching rate of the first masking layer during the said etching treatment is larger near the surface than in the underlying part of the layer. Advantageously, ions of a neutral gas, preferably argon ions, are used for the bombardment. As a result of this it is possible to obtain a p-n junction having a comparatively large radius of edge curvature since an angle of bevel of 5° or less can be obtained at the edge of the first masking layer. As a result of said large radius of edge curvature a comparatively high breakdown voltage of the p-n junction is achieved.

Figure 8:
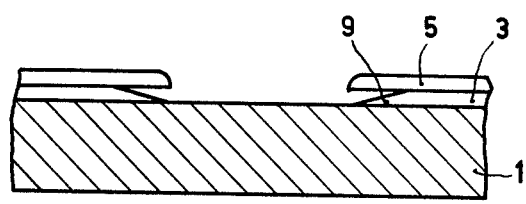
Figure 9:
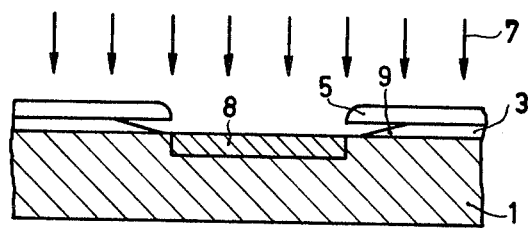
Figure 10:
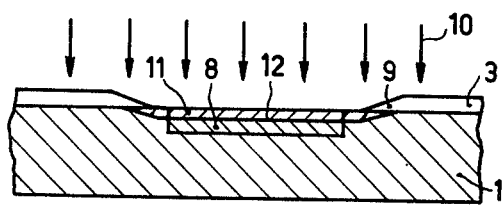

The invention will now be described in greater detail with reference to a few embodiments and the drawing, in which FIGS. 1 to 7 are diagrammatic cross-sectional views of a semiconductor device according to the invention in successive stages of manufacture, and FIGS. 8 to 10 are diagrammatic cross-sectional views of successive stages of the manufacture according to a modified embodiment of the method shown in FIGS. 1 to 7.

The Figures are diagrammatic and not drawn to scale; corresponding parts of the drawing are generally referred to by the same reference numerals.

FIGS. 1 to 7 are diagrammatic cross-sectional views of the manufacture of a capacitance diode in successive stages by using the method according to the invention.

Starting material (see FIG. 1) is a semiconductor body for which in this example an n-type conductive silicon plate 1 having a resistivity of, for example, 4 Ohm.cm is chosen. The thickness of the plate is approximately 200 microns. Although in this example the starting material is a homogeneously doped silicon plate the n-type region 1 may also be formed, for example, by an n-type silicon layer which has been obtained by epitaxial growth on a substrate having a different doping.

A first masking layer 3 is now formed on the surface 2 of the n-type region 1. For this purpose a 0.3 micron thick layer 3 of silicon (di)oxide is provided, for example, by thermal oxidation in moist oxygen at 1100° C. This layer can also be obtained differently, for example, by pyrolytic deposition.

This first masking layer 3 is then subjected to a treatment as a result of which the layer 3 shows at its surface a higher etching rate for an etching treatment to be used later in the process than in underlying parts of the layer 3. For this purpose is advantageously used a particle bombardment, preferably a bombardment with ions of an inert gas. A bombardment with argon ions proves to be very suitable in this respect. In this example a bombardment with argon ions (arrows 4) with a dose of at least $10^{14}$ ions per sq.cm and an energy of at least 20 keV and at most 30 keV is used. As a result of this, a concentration of at least $10^{19}$ argon ions per cm$^3$ with associated structure damage is obtained in the surface layer 3 of the silicon oxide, which is desired to obtain a sufficient difference in etching rate between the surface layer and the remaining part of the oxide layer 3. The depth of penetration ("range"), that is the depth of the maximum concentration of argon ions, is approximately 0.03 micron with a dose of $10^{14}$ irons per sq.cm and an energy of 25 keV. After this treatment the temperature up to the etching treatment may not exceed approximately 175° C, since otherwise the difference in etching rate disappears or decreases considerably.

Although the above-described treatment of increasing the etching rate of the layer 3 at the surface is to be preferred, this can also be achieved differently. For example, the layer 3 may be formed by a composite layer consisting of two or more sublayers lying one on top of the other, for example, a layer of undoped silicon oxide with thereon a layer of silicon oxide which is doped with, for example, phosphorus or boron and thereby shows a higher etching rate for a given etchant than undoped silicon oxide.

A second masking layer 5 is then provided on the first masking layer 3. In principle, this layer 5 may consist of any material which can be etched selectively relative to the layer 3. However, the layer 5 preferably consists of a radiation-sensitive lacquer layer, for example, a lacquer layer which is sensitive to electromagnetic radiation or to electron radiation. In the second masking layer 5 a window 6 is then provided in the usual manner (see FIG. 3), in this example a circular window having a diameter of 500 microns. Subsequently (see FIG. 4) ions of a dopant determining the conductivity type of the substrate region 1 (denoted by arrows 7), so in this case ions of a donor impurity, are implanted in the region 1 via a first surface part bounded by the window 6. Said ions have such an energy that, outside the window 6, they are retained entirely and, inside the window 6, are retained at most only partly. In this example the layer 5 consists of a 1 micron thick photoresist layer and phosphorus ions are implanted with a dose of $10^{13}$ ions per sq.cm and an energy of 320 keV. As a result of this, a first n-type zone 8 (see FIG. 4) is formed in the region 1. The photoresist layer 5 has a sufficient thickness to retain the phosphorus ions. The oxide layer 3 masks the phorphorus ions only partly.

While using the second masking layer 5 as a mask, the etching treatment already mentioned above is then carried out by subjecting the layer 3 to an etching process with a buffered HF solution (consisting, for example, of 10 parts by volume of a solution with 40% by weight of NH$_4$F in water and 1 part by volume of a 50% HF solution in water). This etching treatment is carried out at room temperature for approximately 6½ minutes, after which, as a result of the faster etching along the surface of the layer 3, the layer 3 at the edge of the etched-away part shows a transition region 9 with a thickness increasing towards the exterior, having a width of approximately 3.5 microns so that the angle of bevel of approximately 5° is formed, see FIG. 5. The inner edge of the transition region 9 is in projection at some distance (in this example approximately 0.5 micron) beyond the edge of the first zone 8.

The photoresist layer 5 is then removed and the zone 8 is preferably annealed at approximately 900° C in dry nitrogen for approximately 30 minutes so as to make the phosphorus ions active and to recover damage of radiation. Subsequently (see FIG. 6) the surface is subjected to a bombardment with ions of a dopant determining the opposite conductivity type, in this case with boron ions (denoted by arrows 10) with a dose of $10^{15}$ ions per sq.cm and an energy of 20 keV. This energy is chosen to be so that the boron ions are outside the transition region 9, retained entirely by the resist layer 3 and are retained only partly by at least a part of the transition region 9 of the layer 3. A second p-type zone 11 is formed which adjoins a second surface part which comprises and surrounds entirely the first surface part via which the first zone 8 was provided. The p-type zone 11 has a doping which is so high that the originally provided n-type zone 8 is overdoped at the area of the zone 11. The zone 11 has a smaller thickness than the first zone 8 and a doping concentration which gradually varies in the lateral direction at the edge. The pn-junction 12 between the first zone 8 and the second zone 11 extends parallel to the surface 2 at a distance of approximately 0.15 micron from the surface. An annealing treatment is then carried out in dry nitrogen at 700° C for approximately 30 minutes.

A capacitance diode has now been obtained which can then be contacted in the usual manner by metal layers 13 and 14 (see FIG. 7), if desired via a highly doped contact zone.

The doping of the first zone 8 and the second zone 11 obtained in the described manner has been chosen to be so in connection with the doping of the region 1 that, when the reverse voltage across the pn-junction 12 increases, the depletion region extends throughout the zone 8 before breakdown occurs. As a result of this the breakdown voltage is determined in particular by the comparatively low doping of the region 1 and by the (large) radius of curvature at the edge of the p-n junction 12. The resulting breakdown voltage hence was approximately 100 Volts in several capacitance diodes manufactured in the described manner. This in contrast with capacitance diodes of analogous structure which are manufactured in the conventional manner by means of diffusion and the break-down voltage of which usually is not more than approximately 20 Volts.

The described manner of manufacture can be varied in several manners all of which, however, have the use of only one masking step in common. For example, in the example described the phosphorus ions to form the first zone 8 were implanted through the whole thickness of the first masking layer 3, while the etching treatment to obtain the bevelled transition region 9 was carried out after the formation of the first zone 8. In certain circumstances, however, this sequence may be varied; this may be desired notably when the ions which form the first zone 8 are to have an energy which is not large enough to sufficiently penetrate through the first masking layer 3.

Figure 3:
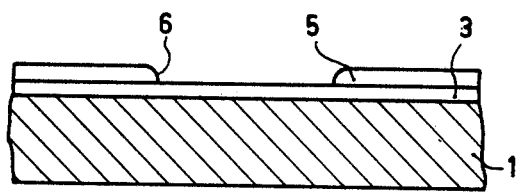
Figure 4:
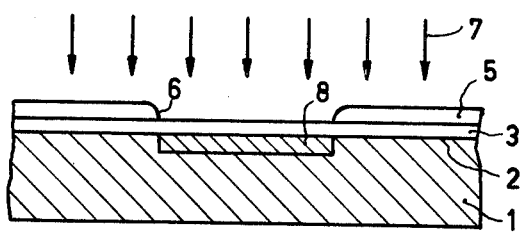
Figure 5:
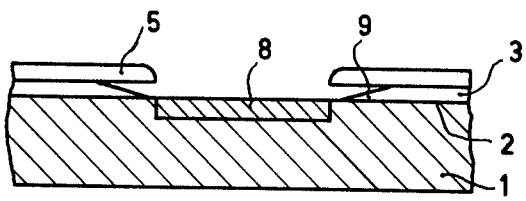
Figure 6:
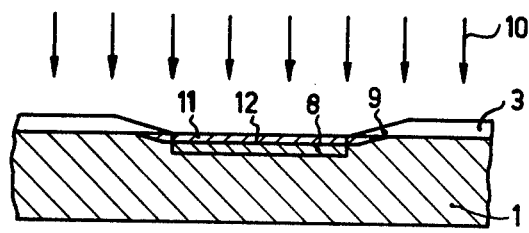
Figure 7:
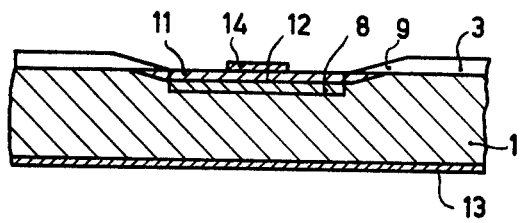

For illustration, such a variation is described in FIGS. 8 to 10, in which the manufacturing steps up to and including FIG. 3 of the preceding example are identical.

In this case, however, as contrasted with the previous example, the first zone 8 is formed after the etching treatment during which the bevelled transition region 9 in the layer 3 is obtained, while using the second masking layer 5 as a mask. For example, in the same manner as described in the first example, the first masking layer 3 (see FIG. 8) is first etched away below the window 6 formed in the layer 5 in such manner that a transition region 9 having a thickness increasing towards the outside is obtained. The layer 5 remains intact and forms a mask against the subsequent ion implantation 7 (see FIG. 9), the first zone 8 of the same conductivity type as the substrate 1 being formed. The second masking layer 5 is then removed and a second bombardment is carried out (arrows 10 in FIG. 10), the second zone 11 of the opposite conductivity type being formed and having gradually varying surface concentrations below the transition region 9, said zone 11 forming with the zone 8 and with the substrate 1 a p-n junction 12 as in the preceding example, which p-n junction has a comparatively large radius of curvature at the edge. Since prior to forming the zone 8, the layer 3 is removed entirely within the mask window in this case for the formation of the zone 8 ions having a lower energy than in the preceding example may be used, if desired. The metallization may be carried out again according to FIG. 7 of the preceding example. The annealing treatments as a result of the crystal damage produced by the ion implantations may also be carried out in a manner analogous to that of the preceding example.

It will be obvious that the invention is not restricted to the examples described which serve only by way of example, but that many variations are possible to those skilled in the art without departing from the scope of this invention. Although the starting material in the examples is a semiconductor body of silicon, germanium or another semiconductor, for example, an $A_{III}$-$B_V$ compound, for example GaAs, may also be used instead of this. Although the etching rate of the first masking layer varying in the vertical direction is preferably achieved by a particle bombardment, said variation in etching rate, as already noted above, can also be reached by doping the surface of the first masking layer or by using a composite first masking layer consisting of layers of different materials lying one on top of the other and having a different etching rate for a given etchant. The first masking layer may consist entirely or partly of a material other than silicon oxide, for example of silicon nitride or aluminum oxide, in which the etchants used will be chosen in an efficacious manner by those skilled in the art. Etching processes which in combination with specific compositions of or surface treatments of the first masking layer result in bevelled junction regions are described in several publications, see for example: IEEE Transactions on Electron Devices, ED20, September, 1973, p. 840 and Journal of the Electrochemical Society, Volume 120, No. 8, August, 1973, pp. 1091–1095 and Volume 120, No. 10, October 1973, pp. 1428–1430.

The second masking layer for which a radiation-sensitive lacquer layer was chosen may of course also consist of a different material, for example a metal layer. However, the masking step becomes slightly more complicated and includes in general, in addition to an exposure and development of a photosensitive layer, also a subsequent etching step.

In the examples described, the first masking layer 3 was either removed entirely or was not removed at all before providing the zone 8. According to a modified embodiment it is possible to remove said layer only over part of its thickness prior to forming the zone 8.

Although in principle the second doped zone 11 may be formed in the presence of both the first and second masking layers, in practice preferably the second masking layer 5 is removed prior to forming the second doped zone 11, as in the examples.

Although the embodiments described related to a capacitance diode, other semiconductor devices can also simply be manufactured according to the method described. For example, the method according to the invention is also very suitable for the manufacture of avalanche (photo) diodes and of zener diodes, the breakdown occurring at the part of the p-n junction between the zones 8 and 11. In the manufacture of all these diodes the method according to the invention shows the important advantage that only one single masking step is necessary. Finally it is to be noted that the doped zones may show arbitrary conductivity types and thicknesses and that in principle a p-n junction need not be present either. In particular all the conductivity types of the various zones in the examples described can be replaced by their opposited conductivity types so that the structures complementary to the examples are obtained. Furthermore the energies and doses of the implantations, as well as the ions used, may be adapted as will for each individual case.

What is claimed is:

1. A method of manufacturing a semiconductor device in a semiconductor body having a surface at a semiconductor region thereof, comprising the steps of:
    (a) providing a first masking layer on said surface of said semiconductor region,
    (b) providing a second masking layer on said first masking layer,
    (c) providing a window in said second masking layer,
    (d) directing toward said layers at a first part of said surface, ions of a dopant material having an energy level such that, outside said window, said first dopant ions being retained entirely by the combined said first and second masking layers and, inside said window, they are retained at most only partly, said ions thus being implanted selectively into said semiconductor region at said first surface part so as to form a first doped semiconductor zone,
    (e) subjecting said first masking layer to an etching treatment while using said second masking layer as an etching mask, so that the exposed part of said first masking layer is etched away and form at the edge of the etched-away part thereof a transition region having a thickness increasing towards the exterior of the window,
    (f) then directing toward said surface of said semiconductor body ions of a second dopant material, said second dopant ions having such energy that said second dopant ions are retained entirely by said first masking layer outside said transition region and are retained only partly by at least a part of the transition region, said second dopant ions thus being selectively implanted into said semiconductor region to form a second doped semiconductor zone that adjoins a second part of said surface, said second surface part comprising and entirely surrounding said first surface part.

2. A method as in claim 1, in which said semiconductor region is of a first conductivity type, wherein said ions are implanted and first doped semiconductor zone has a higher doping level than said semiconductor region, and said second doped semiconductor zone has a smaller thickness than said first doped zone, which second doped zone adjoins the whole second surface part, and forms with the first doped zone a p,n junction extending parallel to the surface.

3. A method as in claim 1, wherein, prior to forming said second doped zone, said second masking layer is removed.

4. A method as in claim 1, characterized in that a first masking layer of silicon oxide is provided.

5. A method as in claim 4, wherein, after providing the first masking layer and prior to providing the second masking layer, said first masking layer is subjected to a particle bombardment as a result of which the etching rate of the first masking during the said etching treatment is larger near the surface of the layer than in the underlying part of the layer.

6. A method as in claim 1, wherein said second masking layer is of a radiation-sensitive lacquer.

7. A method as in claim 6, wherein said particle bombardment is carried out with ions of an inert gas.

8. A method as in claim 7, wherein said particle bombardment is carried out with argon ions.

9. A method as in claim 8, wherein the dose and the energy of the ions used for the said particle bombardment are chosen to be so that the maximum concentration of said ions in the first masking layer near the surface is at least approximately $10^{19}$ per $cm^3$.

10. A method as in claim 9, wherein the energy chosen for said particle bombardment is at least 20 keV and at most 30 keV with a dose of at least $10^{14}$ ions per sq.cm.

11. A method as in claim 1, wherein said ions of said first dopant material are implanted through the whole thickness of said first masking layer.

12. A method as in claim 1, wherein said first masking layer during said etching treatment is removed entirely within the window.

13. A method as in claim 1, wherein said etching treatment is carried out after the formation of the first zone.

14. A method as in claim 1, wherein said first zone of the first conductivity type is formed after said etching treatment while using the second masking layer as a mask.

15. A method as in claim 1, wherein said etching treatment is carried out in such manner that the inner edge of the said transition region is in projection at some distance beyond the edge of the first zone.

* * * * *